United States Patent
Taylor

(10) Patent No.: US 6,803,439 B2
(45) Date of Patent: Oct. 12, 2004

(54) FATTY ACID CONTAINING FIBERGLASS BINDER

(75) Inventor: Thomas J. Taylor, Aurora, CO (US)

(73) Assignee: Johns Nanville International, Inc., Denver, CO (US)

( * ) Notice: Subject to any disclaimer, the term of this patent is extended or adjusted under 35 U.S.C. 154(b) by 0 days.

(21) Appl. No.: 10/370,983

(22) Filed: Feb. 20, 2003

(65) Prior Publication Data
US 2004/0167288 A1 Aug. 26, 2004

(51) Int. Cl.$^7$ ................. C08J 3/24; C08J 5/08
(52) U.S. Cl. ............ 526/329.5; 526/384; 526/386; 524/556; 524/724; 525/221; 525/327.4; 525/327.7; 525/327.6
(58) Field of Search .............. 524/556, 724; 525/221, 327.4, 327.7, 327.6; 526/329.5, 384, 386

(56) References Cited

U.S. PATENT DOCUMENTS

| | | | | |
|---|---|---|---|---|
| 4,312,907 A | * | 1/1982 | Hiraoka et al. | 428/212 |
| 5,318,990 A | * | 6/1994 | Strauss | 524/549 |
| 6,348,530 B1 | * | 2/2002 | Reck et al. | 524/244 |
| 6,596,386 B1 | * | 7/2003 | Reck et al. | 428/292.4 |
| 2002/0091185 A1 | * | 7/2002 | Taylor et al. | 524/249 |
| 2002/0188055 A1 | * | 12/2002 | Chen et al. | 524/494 |

* cited by examiner

Primary Examiner—David W. Wu
Assistant Examiner—Satya Sastri
(74) Attorney, Agent, or Firm—Robert D. Touslee

(57) ABSTRACT

Provided is a fiberglass binder composition which comprises a polycarboxy polymer, polyol and a fatty acid. The binder also preferably includes a catalyst which is an alkali metal salt of a phosphorus-containing organic acid. The resultant binder provides minimal processing difficulties and a product which exhibits minimal water absorption.

21 Claims, No Drawings

FATTY ACID CONTAINING FIBERGLASS BINDER

BACKGROUND OF THE INVENTION

1. Field of the Invention

The subject invention pertains to polycarboxy polymer binding resins having improved water absorption properties. More particularly, the subject invention pertains to thermosetting, acrylic acid-based binder resins which cure by crosslinking with a poly-functional, carboxyl group-reactive curing agent, which binders containing such resins exhibit minimal water absorption. Such binders are useful as replacements for formaldehyde-based binders in non-woven fiberglass goods.

2. Description of the Related Art

Fiberglass binders have a variety of uses ranging from stiffening applications where the binder is applied to woven or non-woven fiberglass sheet goods and cured, producing a stiffer product; thermo-forming applications wherein the binder resin is applied to sheet or lofty fibrous product following which it is dried and optionally B-staged to form an intermediate but yet curable product; and to fully cured systems such as building insulation.

Fibrous glass insulation products generally comprise matted glass fibers bonded together by a cured thermoset polymeric material. Molten streams of glass are drawn into fibers of random lengths and blown into a forming chamber where they are randomly deposited as a mat onto a traveling conveyor. The fibers, while in transit in the forming chamber and while still hot from the drawing operation, are sprayed with an aqueous binder. A phenol-formaldehyde binder has been used throughout the fibrous glass insulation industry. The residual heat from the glass fibers and the flow of air through the fibrous mat during the forming operation are generally sufficient to volatilize the majority of the water from the binder, thereby leaving the remaining components of the binder on the fibers as a viscous or semi-viscous high solids liquid. The coated fibrous mat is transferred to a curing oven where heated air, for example, is blown through the mat to cure the binder and rigidly bond the glass fibers together.

Fiberglass binders used in the present sense should not be confused with matrix resins which are an entirely different and non-analogous field of art. While sometimes termed "binders", matrix resins act to fill the entire interstitial space between fibers, resulting in a dense, fiber reinforced product where the matrix must translate the fiber strength properties to the composite, whereas "binder resins" as used herein are not space-filling, but rather coat only the fibers, and particularly the junctions of fibers. Fiberglass binders also cannot be equated with paper or wood product "binders" where the adhesive properties are tailored to the chemical nature of the cellulosic substrates. Many such resins, e.g. urea/formaldehyde and resorcinol/formaldehyde resins, are not suitable for use as fiberglass binders. One skilled in the art of fiberglass binders would not look to cellulosic binders to solve any of the known problems associated with fiberglass binders.

Binders useful in fiberglass insulation products generally require a low viscosity in the uncured state, yet characteristics sufficient to form a rigid thermoset polymeric mat for the glass fibers when cured. A low binder viscosity in the uncured state is required to allow the mat to be sized correctly. Also, viscous binders tend to be tacky or sticky and hence they lead to accumulation of fiber on the forming chamber walls. This accumulated fiber may later fall onto the mat causing dense areas and product problems. A binder which forms a rigid solid when cured is required so that a finished fiberglass thermal insulation product, when compressed for packaging and shipping, will recover to its as-made vertical dimension when installed in a building.

From among the many thermosetting polymers, numerous candidates for suitable thermosetting fiberglass binder resins exist. However, binder-coated fiberglass products are often of the commodity type, and thus cost becomes a driving factor, generally ruling out such resins as thermosetting polyurethanes, epoxies, and others. Due to their excellent cost/performance ratio, the resins of choice in the past have been phenol/formaldehyde resins. Phenol/formaldehyde resins can be economically produced, and can be extended with urea prior to use as a binder in many applications. Such urea-extended phenol/formaldehyde binders have been the mainstay of the fiberglass insulation industry for years, for example.

Over the past several decades however, minimization of volatile organic compound emissions (VOCs) both on the part of the industry desiring to provide a cleaner environment, as well as by Federal regulation, has led to extensive investigations into not only reducing emissions from the current formaldehyde based binders, but also into candidate replacement binders. For example, subtle changes in the ratios of phenol to formaldehyde in the preparation of the basic phenol/formaldehyde resole resins, changes in catalysts, and addition of different and multiple formaldehyde scavengers, has resulted in considerable improvement in emissions from phenol/formaldehyde binders as compared with the binders previously used. However, with increasingly stringent Federal regulations, more and more attention has been paid to alternative binder systems which are free from formaldehyde.

One such candidate binder system employs polymers of acrylic acid as a first component, and a polyol such as glycerin or a modestly oxyalkylated glycerin as a curing or "crosslinking" component. The preparation and properties of such poly(acrylic acid)-based binders, including information relative to the VOC emissions, and a comparison of binder properties versus urea formaldehyde binders is presented in "Formaldehyde-Free Crosslinking Binders For Non-Wovens", Charles T. Arkins et al., TAPPI JOURNAL, Vol. 78, No. 11, pages 161–168, November 1995. The binders disclosed by the Arkins article, appear to be B-stageable as well as being able to provide physical properties similar to those of urea/formaldehyde resins.

U.S. Pat. No. 5,340,868 discloses fiberglass insulation products cured with a combination of a polycarboxy polymer, a β-hydroxyalkylamide, and an at least one tri-functional monomeric carboxylic acid such as citric acid. The specific polycarboxy polymers disclosed are poly (acrylic acid) polymers. See also, U.S. Pat. No. 5,143,582.

U.S. Pat. No. 5,318,990 discloses a fibrous glass binder which comprises a polycarboxy polymer, a monomeric trihydric alcohol and a catalyst comprising an alkali metal salt of a phosphorous-containing organic acid.

Published European Patent Application EP 0 583 086 A1 appears to provide details of polyacrylic acid binders whose cure is catalyzed by a phosphorus-containing catalyst system as discussed in the Arkins article previously cited. Higher molecular weight poly(acrylic acids) are stated to provide polymers exhibiting more complete cure. See also U.S. Pat. Nos. 5,661,213; 5,427,587; 6,136,916; and 6,221,973.

Some polycarboxy polymers have been found useful for making fiberglass insulation products. Problems of clumping or sticking of the glass fibers to the inside of the forming chambers during the processing, as well as providing a final product that exhibits the recovery and rigidity necessary to provide a commercially acceptable fiberglass insulation product, have been overcome. See, for example, U.S. Pat. No. 6,331,350. The thermosetting acrylic resins have been found to be more hydrophilic than the traditional phenolic binders, however. This hydrophilicity can result in fiberglass insulation that is more prone to absorb liquid water, thereby possibly compromising the integrity of the product. Also, the thermosetting acrylic resins now being used as binding agents for fiberglass have been found to not react as effectively with silane coupling agents of the type traditionally used by the industry. Overcoming these problems will help to better utilize polycarboxy polymers in fiberglass binders.

Accordingly, it is an objective of the present invention to provide a novel, non-phenol/formaldehyde binder.

Yet another object of the present invention is to provide such a binder which allows one to prepare fiberglass insulation products which are less prone to absorb liquid water.

Still another object of the present invention is to provide a fiberglass insulation product which exhibits good recovery and rigidity, is formaldehyde-free, and is more water-proof.

These and other objects of the present invention will become apparent to the skilled artisan upon a review of the following description and the claims appended hereto.

SUMMARY OF THE INVENTION

In accordance with the foregoing objectives, there is provided by the present invention a novel fiberglass binder. The binder composition of the present invention comprises a polycarboxy polymer, a polyol and a fatty acid, preferably a fatty acid which is water dispersible. It is also preferred that the binder comprise a catalyst, such as an alkaline metal salt of a phosphorus-containing organic acid.

An important aspect of the binder of the present invention is that the fatty acid is present in the binder. The presence of the fatty acid in the binder composition has been found to render the binder, and hence the fiberglass mat to which the binder is applied, essentially water-proof. As a result, fiberglass insulation made with the binder of the present invention avoids the possible problem of coming apart when subjected to water, as the binder of the present invention is believed to better repel the water and maintain the integrity of the bond with the fiberglass.

DETAILED DESCRIPTION OF THE PREFERRED EMBODIMENTS

The polycarboxy polymer used in the binder of the present invention comprises an organic polymer or oligomer containing more than one pendant carboxy group. The polycarboxy polymer may be a homopolymer or copolymer prepared from unsaturated carboxylic acids including but not necessarily limited to acrylic acid, methacrylic acid, crotonic acid, isocrotonic acid, maleic acid, cinnamic acid, 2-methylmaleic acid, itaconic acid, 2-methylitaeonic acid, alpha, beta-methyleneglutaric acid, and the like. Alternatively, the polycarboxy polymer may be prepared from unsaturated anhydrides including, but not necessarily limited to, maleic anhydride, methacrylic anhydride, and the like, as well as mixtures thereof. Methods for polymerizing these acids and anhydrides are well-known in the chemical art.

The polycarboxy polymer of the present invention may additionally comprise a copolymer of one or more of the aforementioned unsaturated carboxylic acids or anhydrides and one or more vinyl compounds including, but not necessarily limited to, styrene, alpha-methylstyrene, acrylonitrile, methacrylonitrile, methyl acrylate, ethyl acrylate, n-butyl acrylate, isobutyl acrylate, methyl methacrylate, n-butyl methacrylate, isobutyl methacrylate, blycidyl methacrylate, vinyl methyl ether, vinyl acetate, and the like. Methods for preparing these copolymers are well-known in the art.

Preferred polycarboxy polymers comprise homopolymers and copolymers of polyacrylic acid. It is particularly preferred that the molecular weight of the polycarboxy polymer, and in particular polyacrylic acid polymer, is less than 10000, more preferably less than 5000, and most preferably about 3000 or less. The low molecular weight polycarboxy polymer, when combined with a low pH binder, results in a final product which exhibits excellent recovery and rigidity.

The formaldehyde-free curable aqueous binder composition of the present invention also contains a polyol containing at least two hydroxyl groups. The polyol must be sufficiently nonvolatile such that it will substantially remain available for reaction with the polyacid in the composition during heating and curing operations. The polyol may be a compound with a molecular weight less than about 1000 bearing at least two hydroxyl groups such as, for example, ethylene glycol, glycerol, pentaerythritol, trimethylol propane, sorbitol, sucrose, glucose, resorcinol, catechol, pyrogallol, glycollated ureas, 1,4-cyclohexane diol, diethanolamine, triethanolamine, and certain reactive polyols such as, for example, β-hydroxyalkylamides such as, for example, bis[N,N-di(beta-hydroxyethyl)]adipamide, as may be prepared according to the teachings of U.S. Pat. No. 4,076,917, hereby incorporated herein by reference, or it may be an addition polymer containing at least two hydroxyl groups such as, for example, polyvinyl alcohol, partially hydrolyzed polyvinyl acetate, and homopolymers or copolymers of hydroxyethyl (meth) acrylate, hydroxypropyl(meth) acrylate, and the like. The most preferred polyol for the purposes of the present invention is triethanolamine (TEA).

The ratio of the number of equivalents of carboxy, anhydride, or salts thereof of the polyacid to the number of equivalents of hydroxyl in the polyol is from about 1/0.01 to about 1/3. An excess of equivalents of carboxy, anhydride, or salts thereof of the polyacid to the equivalents of hydroxyl in the polyol is preferred, however, and thus a more preferred ratio of the number of equivalents of carboxy, anhydride, or salts thereof in the polyacid to the number of equivalents of hydroxyl in the polyol is from about 1/0.2 to about 1/0.95, more preferably from 1/0.6 to 1/0.8, and most preferably from 1/0.65 to 1/0.75. A low ratio, approaching 1/0.7 has been found to be of particular advantage in the present invention, when combined with a low molecular weight polycarboxy polymer, and also preferably with a low pH binder.

The binder of the present invention also contains a fatty acid. Fatty acids are carboxylic acids derived from or contained in an animal or vegetable fat or oil. The acids are composed of a chain of alkyl groups containing from 4 to 22 carbon atoms and characterized by a terminal carboxyl radical. The fatty acid can be saturated or unsaturated, and the more dispersible in water, the more preferred. Since the binder composition is preferably sprayed as part of an aqueous mixture, the more dispersible the fatty acid the better and more uniform the coverage of the binder composition on the glass fibers. Among suitable fatty acids are octanoic acid and caproic acid. Unsaturated fatty acids such as oleic acid can also be used. Additives such as emulsifiers can be used if needed to aid in creating an emulsion for spraying. Derivatives of the fatty acid might also be used.

The presence of the fatty acid has been found to help render the binder less prone to absorb water. As a result, the integrity of the bond between the binder and glass fiber, and hence the integrity of the entire product, is better maintained when exposed to liquid water. The binder bond, and hence the overall product, is more water-proof.

Optionally, the binder of the present invention can also contain an imidazoline material, as an additive. The presence of the imidazoline has been found to also help render the binder less prone to absorb water, as described in co-owned and co-pending U.S. application Ser. No. 10/282,076, filed Oct. 28, 2002.

The preferred imidazoline is generally based upon the reaction of a fatty acid with an amine. The reaction forms an amide which then undergoes cyclization at elevated temperatures to form the imidazoline. The fatty acid can be any fatty acid, but is preferably selected from stearic acid, oleic acid or tall oil. The amine can also be any suitable amine, but is preferably comprised of an aminoethylethanolamine. Amines such as diethylene triamine can also be used. From a performance standpoint, oleyl hydroxyethyl imidazoline is the most preferred imidazoline for use in the binder of the present invention.

It is also most preferred that the imidazoline be hydroxy functional as it acts as a coupling agent for resin to glass adhesion. Since acrylic resins do not react very effectively with silane coupling agents, this is an additional advantage in using an imidazoline.

It is preferred that the formaldehyde-free curable aqueous binder composition of the present invention also contains a catalyst. Most preferably, the catalyst is a phosphorous-containing accelerator which may be a compound with a molecular weight less than about 1000 such as, for example, an alkali metal polyphosphate, an alkali metal dihydrogen phosphate, a polyphosphoric acid, and an alkyl phosphinic acid or it may be an oligomer or polymer bearing phosphorous-containing groups such as, for example, addition polymers of acrylic and/or maleic acids formed in the presence of sodium hypophosphite, addition polymers prepared from ethylenically unsaturated monomers in the presence of phosphorous salt chain transfer agents or terminators, and addition polymers containing acid-functional monomer residues such as, for example, copolymerized phosphoethyl methacrylate, and like phosphonic acid esters, and copolymerized vinyl sulfonic acid monomers, and their salts. The phosphorous-containing accelerator may be used at a level of from about 1% to about 40%, by weight based on the combined weight of the polyacid and the polyol. Preferred is a level of phosphorous-containing accelerator of from about 2.5% to about 10%, by weight based on the combined weight of the polyacid and the polyol.

It is most preferred that the pH of the binder of the present invention also be low, i.e., no greater than 4.5. For it has been found that the combination of low molecular weight polycarboxy polymer with a lowered pH provides a binder exhibiting minimal processing difficulties and a final product with excellent recovery and rigidity. Maintaining the pH in the range from 3.5 to 4.5 also allows one to avoid serious problems with conversion of the equipment while still realizing the benefits of the low pH. An even lower pH, with proper handling precautions, is preferred, however. A pH of less than 3.5, e.g., in the range of from 2.5 to 3.5 can successfully be used.

The formaldehyde-free curable aqueous binder composition may contain, in addition, conventional treatment components such as, for example, emulsifiers, pigments, filler, anti-migration aids, curing agents, coalescents, wetting agents, biocides, plasticizers, organosilanes, anti-foaming agents, colorants, waxes, and anti-oxidants.

The formaldehyde-free curable aqueous binder composition may be prepared by admixing the polyacid, the polyol, and the phosphorous-containing accelerator using conventional mixing techniques. In another embodiment, a carboxyl- or anhydride-containing addition polymer and a polyol may be present in the same addition polymer, which addition polymer would contain both carboxyl, anhydride, or salts thereof functionality and hydroxyl functionality. In another embodiment, the salts of the carboxy-group are salts of functional alkanolamines with at least two hydroxyl groups such as, for example, diethanolamine, triethanolamine, dipropanolamine, and di-isopropanolamine. In an additional embodiment, the polyol and the phosphorous-containing accelerator may be present in the same addition polymer, which addition polymer may be mixed with a polyacid. In yet another embodiment the carboxyl- or anhydride-containing addition polymer, the polyol, and the phosphorous-containing accelerator may be present in the same addition polymer. Other embodiments will be apparent to one skilled in the art. As disclosed herein-above, the carboxyl groups of the polyacid may be neutralized to an extent of less than about 35% with a fixed base before, during, or after the mixing to provide the aqueous composition. Neutralization may be partially effected during the formation of the polyacid.

Once the composition of the polyacid and the polyol has been prepared, the fatty acid can then be mixed in with the composition to form the final composition to be sprayed on the fiberglass. The fatty acid is therefore basically an important additive to conventional binder systems, such as that described in U.S. Pat. No. 6,331,350, which is hereby expressly incorporated by reference in its entirety. As molten streams of glass are drawn into fibers of random lengths and blown into a forming chamber where they are randomly deposited as a mat onto a traveling conveyor, the fibers, while in transit in the forming chamber, are sprayed with the aqueous binder composition of the present invention, which includes the fatty acid.

More particularly, in the preparation of fiberglass insulation products, the products can be prepared using conventional techniques. As is well known, a porous mat of fibrous glass can be produced by fiberizing molten glass and immediately forming a fibrous glass mat on a moving conveyor. The expanded mat is then conveyed to and through a curing oven wherein heated air is passed through the mat to cure the resin. The mat is slightly compressed to give the finished product a predetermined thickness and surface finish. Typically, the curing oven is operated at a temperature from about 150° C. to about 325° C. Preferably, the temperature ranges from about 180 to about 225° C. Generally, the mat resides within the oven for a period of time from about ½ minute to about 3 minutes. For the manufacture of conventional thermal or acoustical insulation products, the time ranges from about ¾ minute to about 1½ minutes. The fibrous glass having a cured, rigid binder matrix emerges from the oven in the form of a bat which may be compressed for packaging and shipping and which will thereafter substantially recover its vertical dimension when unconstrained.

The formaldehyde-free curable aqueous composition may also be applied to an already formed nonwoven by conventional techniques such as, for example, air or airless spraying, padding, saturating, roll coating, curtain coating, beater deposition, coagulation, or the like. The waterborne formaldehyde-free composition of the present invention, after it is applied to a nonwoven, is heated to effect drying and curing. The duration and temperature of heating will affect the rate of drying, processability and handleability, and property development of the treated substrate. Heat treatment at about 120° C., to about 400° C., for a period of time between about 3 seconds to about 15 minutes may be carried out; treatment at about 150° C., to about 250° C., is preferred. The drying and curing functions may be effected in two or more distinct steps, if desired. For example, the composition may be first heated at a temperature and for a time sufficient to substantially dry but not to substantially cure the composition and then heated for a second time at a higher temperature and/or for a longer period of time to effect curing. Such a procedure, referred to as "B-staging", may be used to provide binder-treated nonwoven, for example, in roll form, which may at a later stage be cured, with or without forming or molding into a particular configuration, concurrent with the curing process.

The heat-resistant nonwovens may be used for applications such as, for example, insulation batts or rolls, as reinforcing mat for roofing or flooring applications, as roving, as microglass-based substrate for printed circuit boards or battery separators, as filter stock, as tape stock, as tape board for office petitions, in duct liners or duct board, and as reinforcement scrim in cementitious and non-cementitious coatings for masonry.

While the invention has been described with preferred embodiments, it is to be understood that variations and modifications may be resorted to as will be apparent to those skilled in the art. Such variations and modifications are to be considered within the purview and the scope of the claims appended hereto.

What is claimed is:

1. A fiberglass binder, comprising an aqueous solution of a polycarboxy polymer, a polyol and a fatty acid.

2. The fiberglass binder of claim 1, wherein the fatty acid is a saturated fatty acid.

3. The fiberglass binder of claim 1, wherein the fatty acid is an unsaturated fatty acid.

4. The fiberglass binder of claim 1, wherein the fatty acid is comprised of octanoic, caproic or oleic acid.

5. The fiberglass binder of claim 1, wherein the binder further comprises an imidazoline.

6. The fiberglass binder of claim 5, wherein the imidazoline comprises oleyl hydroxyethyl imidazoline.

7. The fiberglass binder of claim 1, wherein the molecular weight of the polycarboxy polymer is less than 5000.

8. The fiberglass binder of claim 1, wherein the molecular weight of the polycarboxy polymer is less than 3000.

9. The fiberglass binder of claim 1, wherein the binder further comprises a catalyst which comprises an alkali metal salt of a phosphorus-containing organic acid.

10. The fiberglass binder of claim 9, wherein the catalyst is sodium hydophosphite, sodium phosphite, or a mixture thereof.

11. The fiberglass binder of claim 1, wherein the polyol is triethanolamine.

12. The fiberglass binder of claim 1, wherein the polycarboxy polymer comprises homopolymers and/or copolymers of polyacrylic acid.

13. The fiberglass binder of claim 1, wherein the amount of polycarboxy polymer and polyol in the binder is such that the ratio of carboxy group equivalents to hydroxyl group equivalents is in the range of from about 1/0.65 to 1/0.75.

14. A fiberglass binder, comprising an aqueous solution of a homopolymer and/or copolymer of polyacrylic acid, where the polyacrylic acid polymer has a molecular weight of 5000 or less, triethanolamine, and a fatty acid.

15. The fiberglass binder of claim 14, wherein the binder further contains a catalyst which comprises an alkali metal salt of a phosphorus-containing organic acid.

16. The fiberglass binder of claim 14, wherein the amount of polyacrylic acid polymer and triethanolamine in the binder is such that the ratio of carboxy group equivalents to hydroxyl group equivalents is in the range of from about 1/0.65 to 1/0.75.

17. A fiberglass product comprising a mat of glass fibers containing the binder of claim 1.

18. The fiberglass product of claim 17, wherein the product is building insulation.

19. The fiberglass product of claim 17, wherein the product is reinforcing mat for roofing or flooring.

20. The fiberglass product of claim 17, wherein the product is a microglass-based substrate useful for printed circuit boards or battery separators, filter stock, tape stock or reinforcement scrim.

21. The fiberglass product of claim 17, wherein the product is filter stock.

* * * * *